(12) United States Patent
Rietzler et al.

(10) Patent No.: US 7,034,688 B2
(45) Date of Patent: Apr. 25, 2006

(54) SELECTIVE METAL REMOVAL PROCESS FOR METALLIZED RETRO-REFLECTIVE AND HOLOGRAPHIC FILMS AND RADIO FREQUENCY DEVICES MADE THEREWITH

(75) Inventors: Manfred Rietzler, Marktoberdorf (DE); Francisco Martinez de Velasco Cortina, Mexico City (MX)

(73) Assignee: Neology, Inc., San Diego, CA (US)

( * ) Notice: Subject to any disclaimer, the term of this patent is extended or adjusted under 35 U.S.C. 154(b) by 438 days.

(21) Appl. No.: 10/118,092

(22) Filed: Apr. 9, 2002

(65) Prior Publication Data

US 2002/0160786 A1 Oct. 31, 2002

(51) Int. Cl.
G08B 13/14 (2006.01)

(52) U.S. Cl. .............. 340/572.7; 340/572.8; 340/5.86; 359/529; 359/2; 205/125; 29/600; 216/102

(58) Field of Classification Search ............. 340/572.7, 340/572.8; 235/492; 359/1, 529; 29/825; 156/60; 343/720, 749, 845, 846, 895
See application file for complete search history.

(56) References Cited

U.S. PATENT DOCUMENTS

| | | | |
|---|---|---|---|
| 3,220,899 A * | 11/1965 | Leonard | 216/104 |
| 4,560,445 A * | 12/1985 | Hoover et al. | 205/126 |
| 4,610,755 A | 9/1986 | Beckett | |
| 4,682,852 A | 7/1987 | Weber | |
| 4,727,360 A | 2/1988 | Ferguson et al. | |
| 4,728,962 A | 3/1988 | Kitsuda et al. | |
| 5,115,182 A | 5/1992 | Ehmke et al. | |
| 5,408,243 A | 4/1995 | D'Hont | |
| 5,477,219 A | 12/1995 | Zarembo et al. | |
| 5,528,222 A | 6/1996 | Moskowitz et al. | |
| 5,557,279 A | 9/1996 | D'Hont | |
| 5,608,417 A | 3/1997 | De Vall | |
| 5,621,571 A * | 4/1997 | Bantli et al. | 359/529 |
| 5,682,143 A * | 10/1997 | Brady et al. | 340/572.7 |
| 5,757,521 A * | 5/1998 | Walters et al. | 359/2 |
| 5,847,931 A * | 12/1998 | Gaumet et al. | |
| 5,894,268 A * | 4/1999 | McLaren | 340/572.8 |

(Continued)

FOREIGN PATENT DOCUMENTS

CH 691098 A 4/2001

(Continued)

OTHER PUBLICATIONS

PCT Written Opinion dated Mar. 2, 2005—International Application No. PCT/IB02/01439 filed Apr. 30, 2002.

(Continued)

*Primary Examiner*—Benjamin C. Lee
(74) *Attorney, Agent, or Firm*—Baker & McKenzie LLP

(57) ABSTRACT

A method for selectively removing metal from a metallized substrate (e.g., a metallized polymer film) and the formation fo devices thereby are provided. The method involves selectively exposing the metallized surface to a demetallizing (i.e., an oxidizing) chemical solution. The metallized layer can be selectively exposed to the demetallizing solution using a flexographic printing process wherein printing rollers are used to transfer the demetallizing solution to the metallized surface. An identification device including, for example, a holographic, retro-reflective, or other metallized material and a radio-frequency transponder are also provided. The radio-frequency transponder includes an RF chip and an antenna in electrical communication with the chip. The identification device including the holographic image allows both electronic identification through the reading of identification data stored in the chip and optical identification via the holographic image.

21 Claims, 7 Drawing Sheets

U.S. PATENT DOCUMENTS

| | | | |
|---|---|---|---|
| 5,945,938 A * | 8/1999 | Chia et al. | 342/42 |
| 5,973,600 A * | 10/1999 | Mosher, Jr. | 340/572.8 |
| 6,018,298 A * | 1/2000 | Endo et al. | 340/572.5 |
| 6,018,299 A * | 1/2000 | Eberhardt | 340/572.7 |
| 6,031,458 A | 2/2000 | Jacobsen et al. | |
| 6,107,920 A * | 8/2000 | Eberhardt et al. | 340/572.7 |
| 6,118,379 A * | 9/2000 | Kodukula et al. | |
| 6,121,880 A * | 9/2000 | Scott et al. | 340/572.5 |
| 6,133,836 A * | 10/2000 | Smith | |
| 6,201,474 B1 * | 3/2001 | Brady et al. | 340/572.8 |
| 6,222,453 B1 * | 4/2001 | Joyce | 340/572.8 |
| 6,265,977 B1 * | 7/2001 | Vega et al. | 340/572.7 |
| 6,608,911 B1 | 8/2003 | Lofgren et al. | |
| 2002/0129488 A1 | 9/2002 | Lieberman | |

FOREIGN PATENT DOCUMENTS

| | | |
|---|---|---|
| JP | 01147078 A * | 6/1989 |
| JP | 2000-085278 A | 9/2000 |
| WO | WO 99/67815 A | 9/1986 |
| WO | WO 00/42472 A | 7/2000 |

OTHER PUBLICATIONS

International Search Report for PCT/IB02/01439 dated Dec. 18, 2002.

European Search Report for EP 02724551.3 dated Apr. 1, 2005.

* cited by examiner

SELECTIVE METAL REMOVAL PROCESS FOR METALLIZED RETRO-REFLECTIVE AND HOLOGRAPHIC FILMS AND RADIO FREQUENCY DEVICES MADE THEREWITH

BACKGROUND OF THE INVENTION

1. Field of the Invention

The present invention relates generally to a process for selectively removing metallic material from a metallized film and, in particular, to the removal of metallic material from a metallized polymeric film using a printing method such as flexographic printing. The film can be a reflective film (e.g., a retro-reflective film) or a holographic film that can be used, for example, in an identification device comprising a radio frequency (RF) transponder.

2. Background of the Technology

Retro-reflective materials can reflect and re-emit incident light in a direction that is parallel to that of the source of the incident light. In other words, retro-reflective materials reflect light directly back toward the source of the light. Such materials and devices are widely used in the areas of nighttime transportation and safety. For example, retro-reflective materials are used to identify highway lanes and road signs using the light emitted from vehicle headlights. Retro-reflective materials are also used for the production of car plates, decals and distinctives for all kinds of vehicles and for truck containers, tractors and other applications. Retro-reflective materials have a bright effect under direct light without disturbing human sight.

Holographic materials have also been used for identification purposes. Since holograms are all but impossible to counterfeit, they are being increasingly used on all types of identification, including driver's licenses, credit cards, bus passes, etc., to increase security.

Both retro-reflective and holographic materials typically contain a very high level of metal such as aluminum. Holograms, for example, are typically stamped from metal foils. It is known that metal blocks the transmission and reception of radio frequency (RF) signals because the RF signal is absorbed or distorted by the metal content in the material. As a result, the signal cannot be received by an antenna blocked by metal. Such a blocked signal cannot be used, for example, to activate a connected device. This same blocking effect can occur whether the device is positioned on top of or underneath the metallic material because the distortion and absorption of the RF signal will be affected in either case. Thus, there is a problem in the prior art with regard to using retro-reflective and holographic materials, as well as other materials containing metals, on the surface of devices for receiving RF signals.

It would be desirable to incorporate an RF transponder into an identification device comprising a retro-reflective material, a holographic image, or other material containing a metal. The RF transponder could be used for electronic identification.

SUMMARY OF THE INVENTION

According to a first aspect of the invention, an identification device is provided that includes retro-reflective or holographic materials, or other materials containing metal, and a usable antenna for receiving radio frequency (RF) signals. The identification device comprises: a base layer; an RF transponder comprising a mounted RF chip and an antenna disposed on the base layer; and a metallized region. The metallized region can comprise a holographic image or a retro-reflective layer. The antenna is in electrical communication with the chip. According to this aspect of the invention, the metallized region has been selectively demetallized such that the RF transponder can transmit and receive information.

According to a second aspect of the invention, a method of forming a pattern in a metallized layer is provided. The method comprises: transferring a metal etching solution to portions of an exposed surface of the metallized layer using a printing process; allowing the etching solution to react with the metallized layer to selectively demetallize the surface; and washing the selectively demetallized surface.

According to a third aspect of the invention, a method of making an identification device comprising a base layer and at least one metal region disposed thereon is provided. The method comprises: selectively demetallizing a first metal region of the device; forming a holographic image in the first metal region; forming an antenna on the base layer; and mounting an RF chip on the base layer in electrical communication with the antenna to form an RF transponder. According to this aspect of the invention, the selective demetallization of the first metal region allows the RF transponder to transmit and receive information.

According to a fourth aspect of the invention, a method of making an identification device comprising a base layer and a metallized retro-reflective layer is provided. The method comprises: forming a selectively demetallized retro-reflective layer on the base layer; forming an antenna on the base layer; and mounting an RF chip on the base layer in electrical communication with the antenna to form an RF transponder. According to this aspect of the invention, the selective demetallization of the retro-reflective layer retains the retro-reflective properties of the retro-reflective layer while allowing the RF transponder to transmit and receive information.

Additional advantages and novel features of the invention will be set forth in part in the description that follows, and in part will become more apparent to those skilled in the art upon examination of the following or upon learning by practice of the invention.

BRIEF DESCRIPTION OF THE FIGURES

The invention will be described with reference to the accompanying figures, wherein.

DETAILED DESCRIPTION OF THE INVENTION

Figure 1:
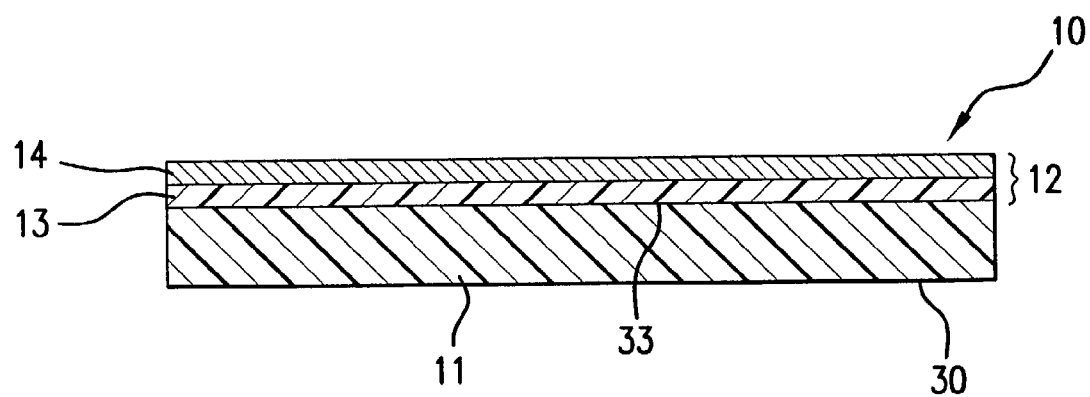
FIG. 1 is a lateral cross-sectional view of a metallized substrate suitable for making an identification device according to the invention.

The present inventors have discovered a method by which a radio frequency (RF) device can be integrated into an identification device comprising a metallized reflective (e.g., a retro-reflective) or holographic material. In particular, the present inventors have discovered that, by selectively removing metal from the metallized layer, the conductivity of the metallized layer can be broken and the effect of absorption and distortion of the radio waves that an RF device uses as a power source can be reduced. In this manner, a radio frequency device can be incorporated into a retro-reflective or holographic material, such as a license plate, a decal (e.g., for a car license plate) or an identification card.

According to the invention, a demetallizing solution, such as a solution of sodium hydroxide (NaOH), can be used in place of ink in a printing process to selectively demetallize a metal layer. In particular, the demetallizing solution can be poured into the stainless steel trays of a printing apparatus. The demetallizing solution can then be applied to the metallized surface using a printing process. For example, the solution can be applied to a printing plate having a raised pattern. The plate can then be contacted with the metallized surface such that the solution on the raised areas is transferred to the metallized surface. The application of the demetallizing solution to the metallized surface can be controlled by the inking rollers of a printing apparatus (e.g., by the pressure applied to the inking rollers).

According to a preferred embodiment of the invention, the demetallizing solution is applied to the metallized layer using a flexographic printing process. The flexographic printing process is a rotary in-line printing method that uses flexible resilient plates with raised images to apply inks to a substrate. According to a preferred embodiment of the invention, the flexographic printing process can be performed using laser-engraved anilox rolls to allow for high resolutions.

By using a printing process, such as a flexographic printing process, the sodium hydroxide solution can be transferred to selective portions of the metallized film. In this manner, metal can be selectively removed from those areas. According to the invention, the exposure time of the metallized layer to the sodium hydroxide solution can be controlled to ensure that the resulting chemical reaction sufficiently removes metal from the desired areas.

According to the invention, after the demetallization process is complete, the selectively demetallized film can be transferred to a washing unit where any excess or remaining chemical solution can be removed. According to a preferred embodiment of the invention, washing of the demetallized surface can be accomplished using fine sprinklers.

The metallized film, which has been moistened by the previous wash, can then be subjected to a residue evaporation process. Residue evaporation can be accomplished using a set of two rolls (e.g., one made of rubber, one made of steel), as well as by such processes as use of air-cleaning filters, sponges and/or blown air. The residue evaporation process can be used as a preparation step preliminary to a heat-driven drying stage. During the heat-driven drying stage, the heat can be generated, for example, by electrical resistance.

The metal removal process according to the invention can be used to produce a metallized material that is non-blocking to radio frequency transmissions. Therefore, a radio frequency device can be incorporated into an identification device (e.g. a card or plate) having a metallized (i.e., a retro-reflective or holographic) layer. As a result of the demetallization process, the radio-frequency device can transmit or receive information while in close proximity to the metallized layer. Additionally, by using a selective demetallization process according to the invention, the metallized film can be made translucent. Therefore, a visible seal can be incorporated beneath the metallized layer according to the invention.

Features of the present invention directed to a metal-removal process for a metallized material (e.g., a metallized polymer film) will now be described in greater detail. According to a preferred embodiment of the invention, the method comprises subjecting the metallized material to a flexographic printing process, wherein the inks are replaced by a metal etching solution. According to a preferred embodiment of the invention, the metal etching solution is an oxidizing solution. For example, an oxidizing solution can be poured into the stainless steel ink trays of a standard flexographic printing station. The oxidizing solution according to the invention preferably comprises sodium hydroxide (NaOH), water ($H_2O$), and, optionally, ethylene-glycol. The ethylene glycol can be used as a density-reduction agent.

According to a preferred embodiment of the invention, the oxidizing solution can be transferred to the inking rollers through a second roller (i.e., an "anilox" roller). The oxidizing solution can then be transferred to a third roller, which conveys the solution to the metallized surface.

The exposure time of the metallized surface to the demetallizing solution can be controlled to ensure that the resulting chemical reaction removes the metal properly from the desired areas.

As set forth above, the demetallizing solution according to the invention can be an aqueous solution of sodium hydroxide (NaOH). When NaOH contacts the metallic surface, the metal is converted into a metallic oxide via an oxidative chemical reaction. To stop this oxidative process, the metallized surface can be washed with water. For example, the metallized surface can be washed using fine sprinklers to cover the entire metallized surface to ensure the removal of any residue and/or excess of the demetallizing solution.

The present invention also relates to the manufacture of an identification device created with a metallized material (e.g., a retro-reflective or holographic material), which device includes a chip and an antenna (i.e., a radio frequency device). According to a preferred embodiment of the invention, the antenna can be formed from the same metallized layer used to manufacture the reflective or holographic material. When the device is made with a holographic image, an identification device can be provided having a capability of both electronic identification (i.e., via the reading of data stored in the chip) and optical identification (i.e., using the holographic image). For example, the device can be configured as an identification card that allows an electronic identification through the reading of data stored in the chip and the optical identification via a check of the hologram on the device.

For the holographic image on the identification device, metallic films such as aluminum films can be used. The metallic films can be grouped on the device to form the hologram using known techniques. For example, the hologram can be made using conventional techniques, such as forming the hologram by stamping a metal foil with a hologram plate made using an engraving process.

In the case of identification cards or identification stickers, which can allow the transmission of identification data stored in a chip to a reading device, a grouping technique can be used involving coupling a transporting unit with a chip and an antenna. The antenna can be made by placing a wire conductor on the device or by etching the antenna in the metallic film.

A purpose of the invention is therefore to provide an identification device that allows both optical identification via a holographic image on the device and electronic identification via an RF chip mounted on the device. The metallized layer can be used to prepare both the antenna for the RF device as well as to prepare the optical image on the device. The fact that the antenna and the image can be made from the same metallized layer represents an advantage since only a single metallized layer is required. As a result, the manufacturing process can be simplified and the cost of manufacturing the device can be reduced.

Additionally, the antenna and the image device can be formed on opposite sides of a substrate material. It may also be advantageous to build the antenna on the device in several parts (i.e., by making one part of the antenna on the same side as the image device and the other part of the antenna on the side opposite the optical image). In this case, a high power antenna can be made on a relatively small identification device.

Depending specifically of the desired frequency of the oscillating circuit made by the chip and the antenna, the antenna may be produced as a coil or as a dipole. To influence the oscillating chip frequency behavior, it may be advantageous to use the image material at least partially to make an electronic commutation element. For example, the image material may be used for making a part of the antenna. This is particularly advantageous when the antenna is made as an antenna coil. It is also possible to use the image material to make a capacitor element. To prevent the creation of metallic layers that may negatively affect the antenna's electromagnetic field, it may be useful to superimpose the image structure with a superficial structure to separate the metallic surface from the hologram support, thereby creating electrically isolated partial metallic layers.

Turning to the figures, FIG. 1 shows the side view of an identification unit 10 according to the invention having a substrate or base layer 11 which has a metallized film or foil 12 mounted on its upper surface 33. The lower surface 30 of the substrate 11 is also shown. As shown, the metallized film or foil 12 comprises a film 13 coated with a metallic layer 14. The film 13 is preferably a dielectric film, such as a polymer film. Polyethylene terephthalate (PET) is a preferred material for the film. Other materials, however, can also be used for the film 13. The substrate is also preferably a dielectric material. However, the substrate 11 can be made of material with either electrically conductive or dielectric properties depending on the type of film 13 used. For example, if the film 13 is a dielectric material, such as a polymer film, the substrate 11 does not have to be a dielectric material.

The identification device 10 shown in FIG. 1 can be in the form of a card or an identification label. A label is typically more flexible than an identification card. The rigidity of the identification device can be varied by the choice of the material used for substrate 11 and by the thickness of substrate 11.

In addition, it should be noted that the identification device 10 shown in FIG. 1 does not necessarily represent the actual end product but can, in addition to the layers shown in FIG. 1, be provided with further layers, particularly layers covering the top and the bottom. Further, if the identification unit is to be constructed as an identification label, the device can be provided with an adhesive surface such as a pressure sensitive adhesive surface.

Figure 2:
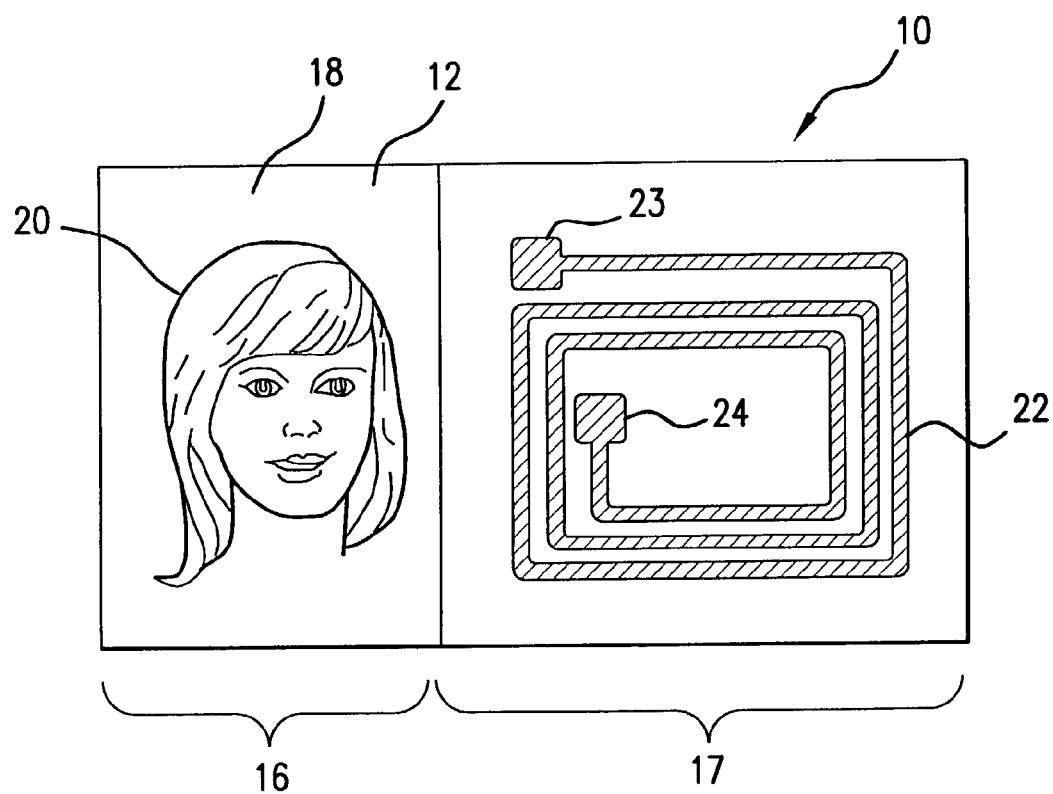
FIG. 2 is a top view of an identification device according to the invention comprising a holographic image and an antenna.

FIG. 2 is a top view of an identification device 10 according to the invention. As shown in FIG. 2, metallized layer 12 has been divided into two fields placed in adjacent position: a holographic image field 16 and an antenna field 17. In the holographic field 16, the metallic film 12 forms a holographic image 18 that can be transferred to the identification device in a known manner (e.g., by using a stamping process) to form a hologram 20.

As shown in FIG. 2, the antenna field 17 comprises an antenna coil 22 created, for example, by using a chemical etching technique according to the invention. The coil as shown is provided on each end with contact fields 23 and 24. Contact fields 23 and 24 are provided as through contacts that provide an electric connection with the bottom surface 30 of the base layer 11, as shown in FIG. 3.

For the construction of the antenna coil 22 shown in FIG. 2, a corrosive material (i.e., an aqueous NaOH solution) can be printed onto the metallic layer 14 to selectively remove portions of the metallic layer 18 from the metal foil 12, thereby leaving behind only the area defined as the antenna coil 22.

Figure 3:
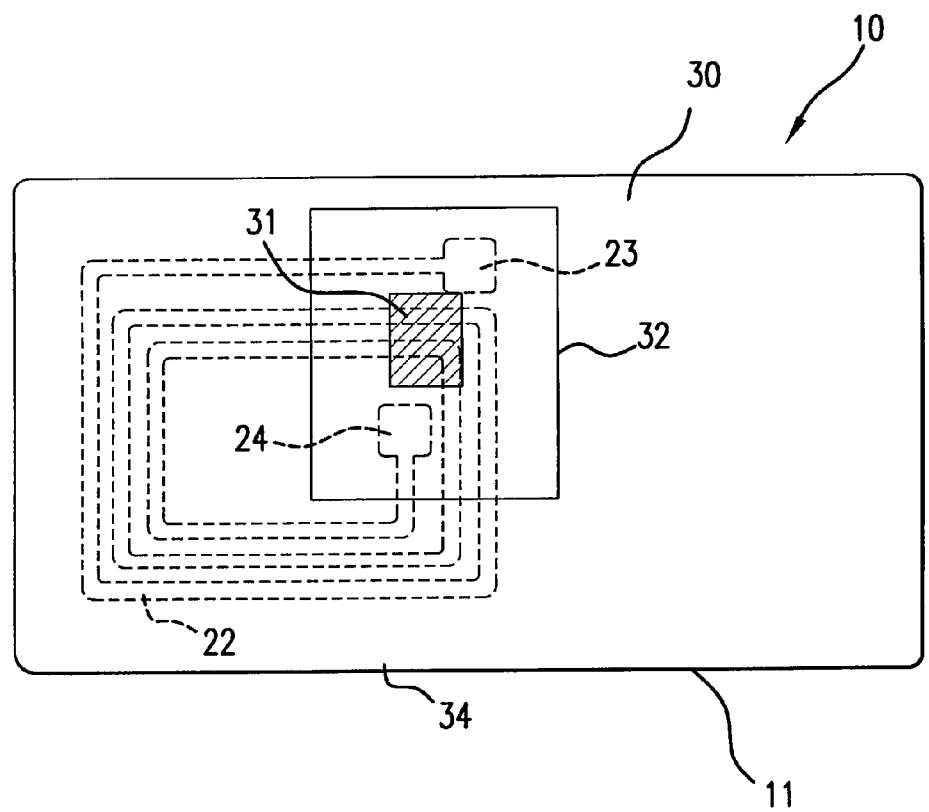
FIG. 3 is a bottom view of the identification unit shown in FIG. 2, showing a chip module mounted on the bottom surface of the identification device.

FIG. 3 shows the bottom view of the device of FIG. 2. As shown in FIG. 3, the contact points 23, 24 of the antenna coil 22 are connected as through-contacts to a chip 31 on the bottom side 30 of the substrate 11 which, as shown, is mounted in a chip module 32 to make electrical contact between the antenna 22 and chip 31 easier.

The antenna coil 22 and the chip 31 of the identification device 10 shown in FIGS. 1 to 3 forms a transponder unit 34 which enables, by means of a reader unit, contact-free access to the data on the chip 31 for purposes of electronic identification. At the same time, the hologram 20 mounted on the upper side of the identification unit 10 enables optical identification to be made.

Figure 4:
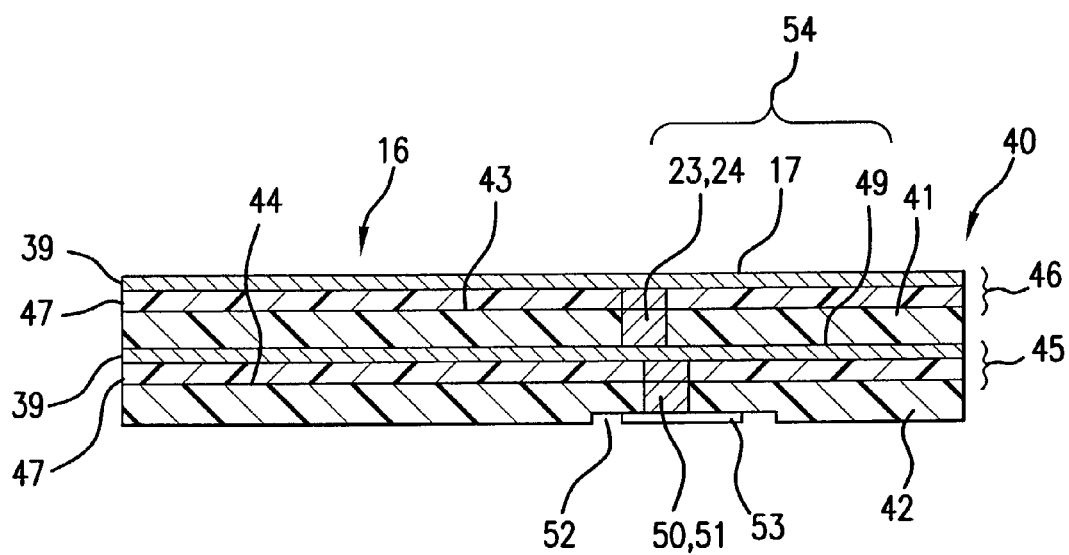
FIG. 4 is a lateral cross-sectional view of a further embodiment of a device according to the invention, comprising two metallized layers arranged one above the other.

FIG. 4 illustrates an identification device 40 having two substrates 41, 42 lying on top of each other, each of which has a metallized foil 45, 46 mounted on its upper surface 43, 44. The components are arranged in such a way that metallized foil 45 is positioned between substrates 41 and 42 and metallized foil 46 is situated on the upper surface 43 of the metallized layer 41 and forms at the same time the top layer of the identification device 40. As shown in FIG. 4, each of the metal foils 45, 46 comprises a film or foil layer 47 having a metallized surface 39. According to a preferred embodiment of the invention, the metal foils 45, 46 comprise a polymer film having a metallized surface comprising aluminum.

In the identification unit 40 shown in FIG. 4, the upper metal foil 46 is structured or divided up in the same way as metal foil 12 of FIG. 2. That is to say, the identification device 40 is provided with both a hologram 20, for example, in a hologram area 16 as well as an antenna coil 22 in an antenna area 17. As shown, the metal foil 45 mounted on the upper side 44 of substrate 42 and arranged between substrate 42 and substrate 41 is provided with a second antenna coil 49 which is in electrical contact with a first antenna coil located on antenna area 17 via through-contacts with contact points 23, 24. The second antenna coil 49 is itself connected by through-contacts with contact points 50, 51 which themselves are connected to a chip module 53, which is mounted in a recess 52 in the bottom of substrate 42. In this way, the antenna coils 22 and 49 each form a component of the complete antenna unit 54 of identification device 40.

Figure 5:
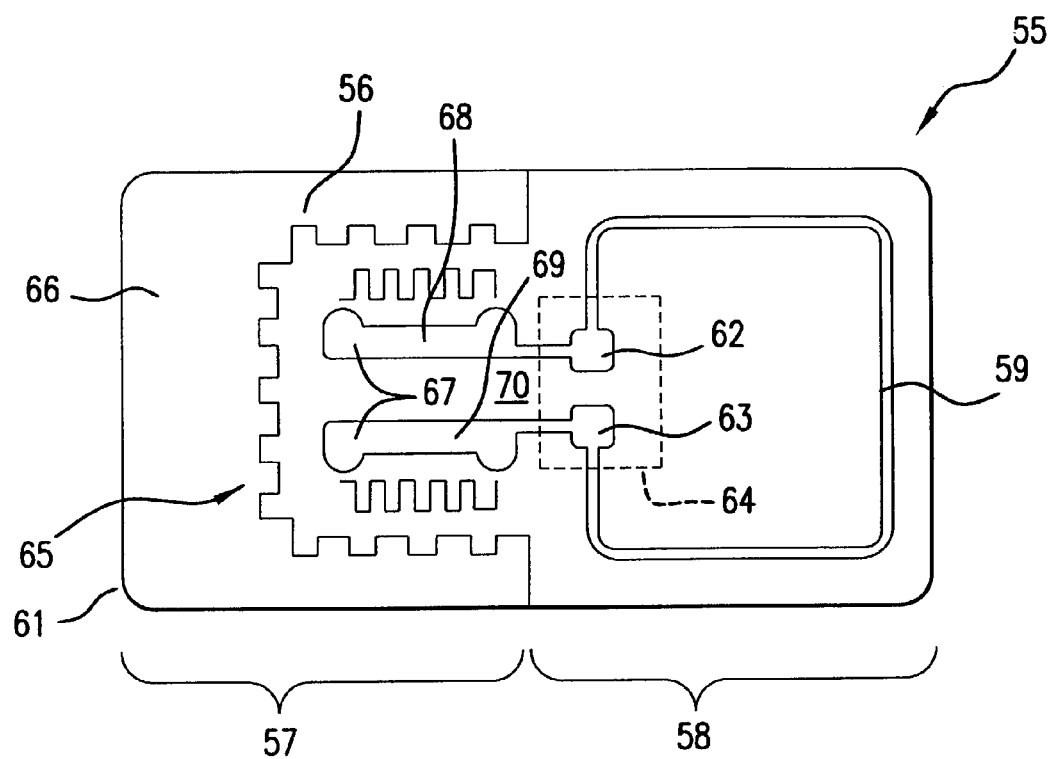
FIG. 5 is a top view of a device according to the invention, wherein the antenna is in electrical communication with the holographic image.

FIG. 5 illustrates a top view of an identification device 55 comprising a metal foil 56 on the upper side of a substrate, not shown. In a similar manner to metal foils 12 and 46 of FIGS. 2 and 4, respectively, identification device 55 comprises, for example, a hologram or retro-reflective area 57, or other metallized substance, and an antenna area 58. The antenna area 58 as shown in FIG. 5 comprises a single antenna coil 59, which can be created in the manner previously described by selectively etching a metal foil made up of a metallic layer 61 deposited on a film or foil layer (not shown). As shown, the antenna coil 59 is provided with contact points 62, 63. Contact points 62, 63 can be designed as through-contacts connected to contact areas of a chip module 64 mounted on the bottom side of the substrate.

In the hologram or other metallized area 57 of metal foil 56, a hologram or other image 65 is formed in the metallic layer in the manner previously described. As shown in FIG. 5, however, the hologram or other metal material 65 comprises two image sections 66, 67 which are electrically isolated from each other and which form, when viewed, a complex connected optical structure. The smaller image section 67, is electrically isolated from the larger image section 66. As shown, the smaller image section 67 comprises two metal surfaces which appear generally as two U-shaped islands. As shown in FIG. 5, each of these metal surfaces are connected with a contact area 62 or 63 and form the panels 68, 69 of a capacitor unit 70.

Figure 6:
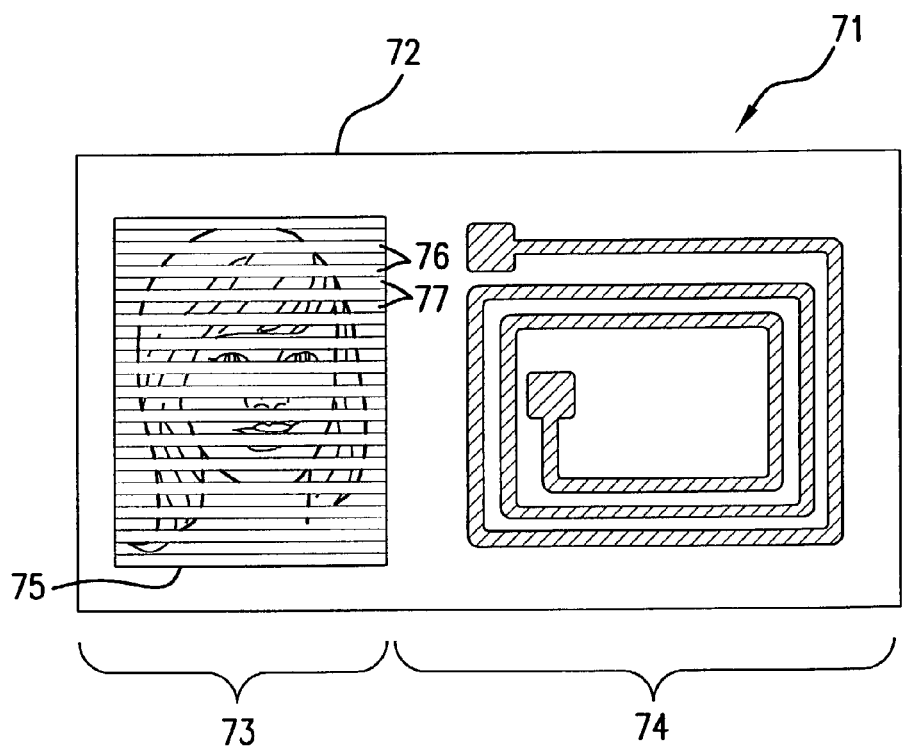
FIG. 6 is a top view of a further embodiment of an identification device according to the invention, wherein the device has a selectively demetallized holographic image.

FIG. 6 shows an identification device 71 comprising a metal film 72, similar to the metal films 12, 46, 56 shown in FIGS. 2, 4, and 5, respectively. As shown, the identification device 71 also comprises a holographic field 73, which could also or alternatively include other types of images, or for example, retro-reflective material, and an antenna field 74. In contrast to the metal film 12 shown in FIG. 2, however, the metal film 72 is a reticulated metallic coating having lines or stripes of metallic material 75. As a result, the image is formed from non-metallic fields 76 alternating with metallic fields 77. Such a structure can be created using the same process as the antenna coil 22 using the previously described printing/chemical etching procedure. In particular, the continuous metal coating in the holographic field 73 can be reticulated by printing lines of a chemical etchant on the continuous metal coating. As a result, a reticulated holographic material (i.e., with alternating lines or stripes of metallic material removed) can be formed.

When FIGS. 2 and 6 are compared, it can be seen that the image contents of the holographic material 78 of FIG. 6 and the holographic material 20 of FIG. 2 are similar. However, the images have different resolutions. In particular, the image in FIG. 6 has a lower resolution due to the reticulated structure of holographic material 78. However, the reticulated structure of holographic material 78 reduces interference with RF energy such that an RF transponder can be mounted on the identification device 71.

Figure 7:
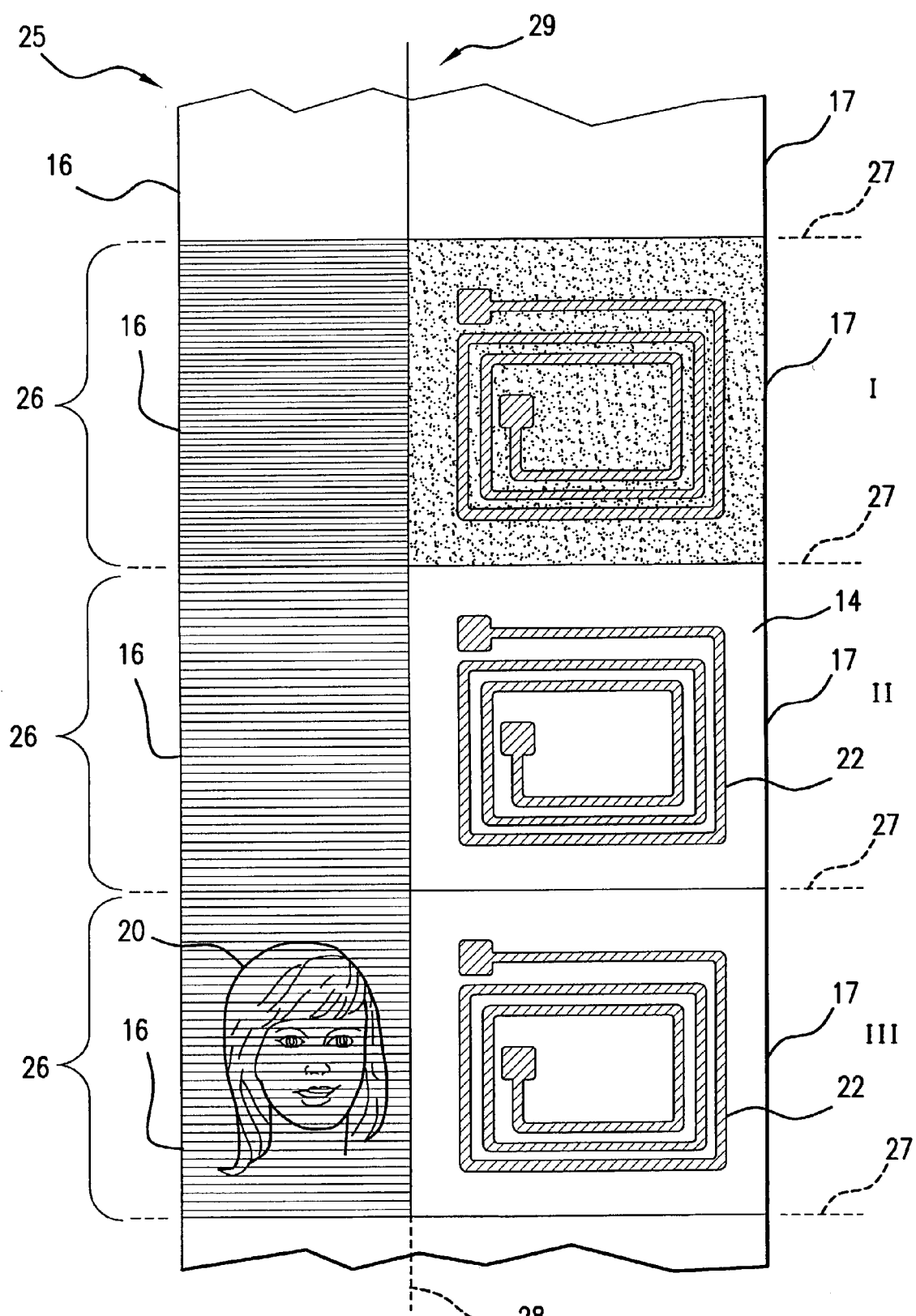
FIG. 7 illustrates a method of making identification devices from a continuous strip of metallized material having multiple segments that may be separated from the strip to make individual identification devices, in accordance with embodiments of the invention.

FIG. 7 illustrates a method of manufacturing a metal foil having a holographic or other metallized field and an antenna field, such as the metal foil 12 shown in FIG. 2. In particular, a metal foil strip 25 with a large number of foil segments 26 connected to each other in continuous order is shown in FIG. 7. When the metal foil strip 25 is separated lengthwise along the dotted severance lines 27, individual metal foil sections, such as metal foil 12 in FIG. 2, can be provided.

As shown in FIG. 7, the metal foil strip 25 comprises, in the running direction 28, a sequence of hologram or other metallized areas 16 and antenna areas 17, continuously following on from each other, which, as shown, are situated on the left and right sides of a central running line 29. The arrangement of the hologram or other metallized areas 16 and the antenna areas 17 in one long line following each other in the running direction 28 enables the continuous production of holograms or other metallized materials 20 in the hologram or other metallized area 16 and of antenna coils 22 in the antenna area 17 when the metal foil strip 25 moves forward in the running direction 28. In addition, the forward movement of the metal foil strip 25 can be phased in such a way that, at various stages (indicated in FIG. 7 as stages I, II and III), various operations can be performed on the foil. In particular, the antenna area 17 on the metal foil strip 25 can undergo printing with a metal etchant in stage 1. The remains of the corrosive material can be washed away, while, at the same time, the oxidized areas of the metallic layer 14 can be removed in stage II. Finally, the antenna area 17 of the metal foil strip 25 can be dried (stage III).

In conjunction with the production of the antenna coil 22 in the antenna area 17 of the metal foil strip 25, the metallized layer in the holographic or other metallized field 16 can be selectively demetallized as shown in FIG. 7. Further, the holographic or other metallized material 20 can be formed in the hologram or other area 16 of the metal foil strip 25 (e.g., by means of a revolving press) after the demetallization process.

In order to construct the identification device 10 shown in FIG. 2, the metal foil strip 25 having holograms or other metallized materials 20 formed in the hologram or other metallized areas 16 and antenna coils 22 formed in the antenna areas 17 can be positioned on a substrate, not shown, laminated (e.g., with an adhesive) and separated along the severance lines 27 to provide individual identification devices, such as the identification device 10 shown in FIG. 2.

A demetallizing process according to the invention will now be described in more detail.

Once the areas to be demetallized have been determined (e.g., using graphical design) a rubber engraving (e.g., flexographic plate) can be made to cover the printing roller that is going to be used to deposit the demetallizing solution (e.g., an aqueous solution of sodium hydroxide) on the metallized surface of the film. The sodium hydroxide solution can, for example, be placed in one of the printing stations of a conventional flexographic printing apparatus. For example, the demetallizing solution can be placed in a stainless steel tray typically used for holding ink. The demetallizing solution can then be applied to the metallized surface by means of the printing roller such that the demetallizing solution is selectively transferred to areas of the metallized surface which are going to be demetallized. The volume of sodium hydroxide that is "printed" on the metallized film can be controlled, as with printing using ink, by, for example, the structure (i.e., the resolution) of the printing roller (i.e., the anilox roller) and the inking rollers and by the pressure that is exerted on the printing roller.

Although the demetallizing effect is practically immediate once the demetallizing solution is applied to the metallized surface, it may be desirable to allow the demetallizing solution to remain a certain amount of time in contact with the metallized surface so that the chemical reaction is completed in those areas in contact with the solution.

To stop the oxidizing effect of the solution, the metallized surface can be washed with water (preferably non-recycled). For example, the metallized surface (previously printed) can be passed through a washing area where the residual sodium hydroxide and the oxidized metal (i.e., aluminum oxide) can be removed. In a preferred embodiment, the water will wet the entire printed area of the metallized surface. For example, fine sprinklers can be used to cover the entire printed area. In order to make the washing process more efficient and to completely remove the residuals of the chemical process, washing may be repeated one or more times using fresh water each time.

Before the film enters the drying station, it may be desirable to remove excess water from the metallized surface in order to facilitate the evaporation of and remaining residual water. In order to remove the water, it is recommendable to use a pair of rollers (e.g., one of rubber and another metallic), air cleaners, sponges and/or air sprinklers. Finally the film is passed through the drying unit through for a heat dry (e.g., using electrical resistance heating) to completely remove the water from the material.

As a complement to the method of selective demetallizing, it is possible to include in the same line of production an overprinting process with ink. In this manner, the effects of demetallizing and printing can be obtained on the same material.

Compared with solvent based inks, water based inks are very manageable, clean and highly resistant to ultraviolet (UV) light. For these reasons, water based inks are desirable. Nevertheless, because one of the sub-processes of the demetallizing process is washing, it is preferable to print with water based inks after the demetallizing and washing steps have been completed.

In addition, if certain metallized areas are desired not to be printed, it is possible to use a transparent solvent based varnish for print protecting the metallized film. After print protection, the metallized layer can be demetallized. In this manner, higher resolutions can be achieved. This technique can be used in high security applications to produce microtext and/or very fine lines.

Figure 8:
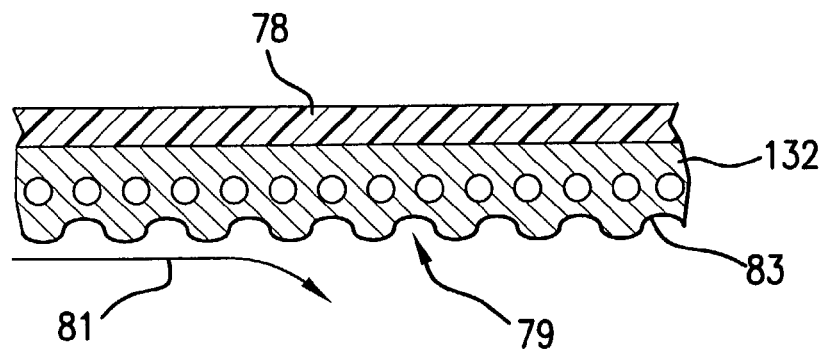
FIG. 8 illustrates a method of selectively removing metal from a metallized substrate according to the invention.

A demetallizing process for use with a metallized, such as a retro-reflective material, according to the invention is described below in reference to FIG. 8. First, any liner or protective layer 81 present on the metal layer 83 is removed to expose the metal. In FIG. 8, the metal layer 132 is shown disposed on a carrier or base layer 78. The carrier or base layer 78 can be polyvinyl chloride or polyethylene terephthalate. The metal layer 132 is then selectively exposed 79 to the corrosive action of a corrosive material, such as a sodium hydroxide solution, using a flexographic, screen, offset or any other printing process to remove metal from the desired areas. This process is described in detail in Mexican Patent Application Nos. 2001/010968 and 2001/010969 as well as in German Patent Application No. 101 21 126. These applications are herein incorporated in their entirety by reference. Selective metal removal can be used to form an antenna for the RF transponder.

As a second step, a fine line demetallizing process can be performed over the remaining metal surface using the same demetallizing process to break the conductivity of the metal layer and the absorption or distortion of radio waves. This allows the RF energy to be captured by the antenna of the radio frequency device. This process is preferably done at a high resolution to maintain the retro-reflective (or, for example, holographic) properties of the remaining metal layer while, at the same time, interrupting the conductivity of the metal to allow RF reception and transmission.

According to a preferred embodiment of the invention, the metallized layer is demetallized in a square grid pattern comprising a first set of parallel lines of demetallized material oriented at right angles to a second set of parallel lines or demetallized material. According to a further embodiment of the invention, the squares of metallized material in the square grid pattern will have dimensions of 5 mm×5 mm or less, more preferably 3 mm×3 mm or less. It has been found that, when the squares of metallized material have dimensions of about 5 mm or less, shielding (i.e., distorion and/or absorption) is reduced to about 5% or less and when the squares of metallized material have dimensions of about 3 mm or less, shielding (i.e., distorion and/or absorption) is reduced to about 1% or less.

Although a square grid demetallized pattern is preferred, other patterns can be employed according to the invention. When other patterns are employed, it is preferred that the longest straight line that can be drawn on any metallized area is about 5 mm or less, more preferably about 3 mm or less.

Figure 9:
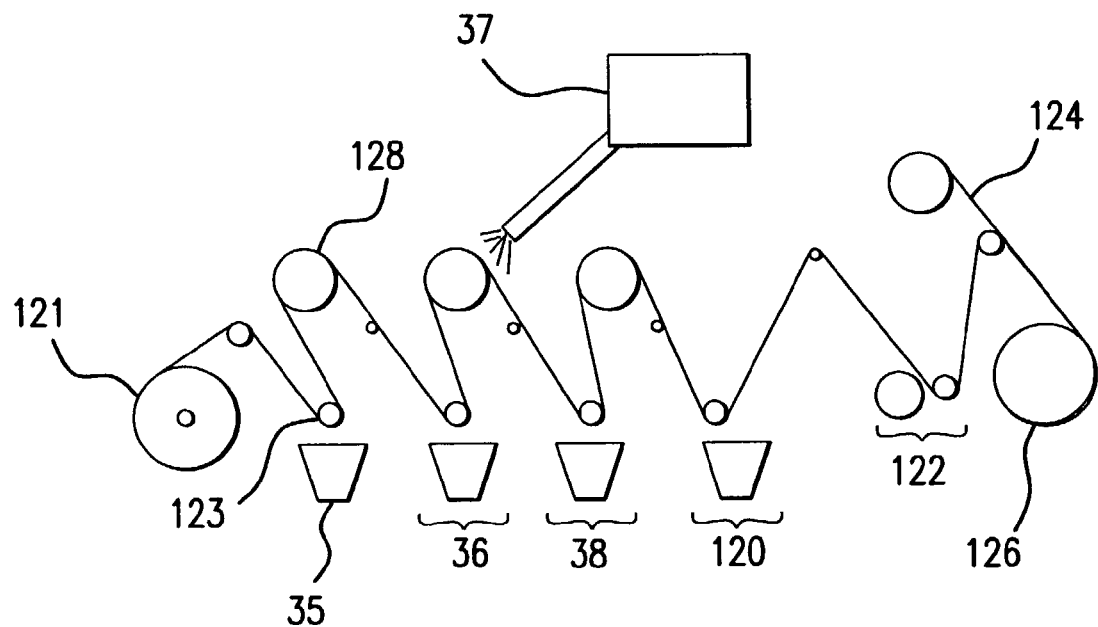
FIG. 9 shows an apparatus that can be used for the continuous selective demetallization of a metallized film according to the invention.

A schematic of an apparatus for selective demetallization of a roll of metallized material is shown in FIG. 9. As shown in FIG. 9, metallized material (e.g., retro-reflective material) from a roll 121 is unrolled and passed over a printing roller 123 where a chemical etchant (e.g., NaOH) from reservoir 35 is applied in a desired pattern. The printed metallized layer is then passed over a temperature application roller 128 to a washing station 36. After washing, hot air from dryer 37 is directed over the surface of the washed material. Afterward, the selectively demetallized material is optionally transferred to various printing stations 38, 120 so that designs can be overprinted thereon. After over-printing, the metallized material can be transferred to an adhesive application roller 122 and adhesively bonded to a carrier material or base layer material 124. The base layer material 124 can have perforations (not shown) to allow for separation of individual identification devices from the continuous length. After bonding to the base layer, the material is shown wound onto a take-off roller 126.

After exposing the material to the demetallizing agent, the demetallizing process can be terminated by washing the surface with water and immediately drying. Afterward, a design can be over-printed on the identification device using a fixed or variable printing process.

Once the metal is removed from an area of the device, it is possible to mount a radio frequency device in the demetallized area. The radio-frequency device can be used as a label or as an identification tag, such as a car license plate.

In one example application, labels according to the invention can, for example, be used for all types of vehicle control. The labels can be provided in auto-adhesive form for use with a car license plate, a tractor platform or for container information, vehicle control applications, etc. The labels can be provided with read and write capabilities and can include biometric data, such as fingerprints, iris recognition data, facial recognition data, voice recognition data, picture data and traffic violation data for drivers.

Figure 10:
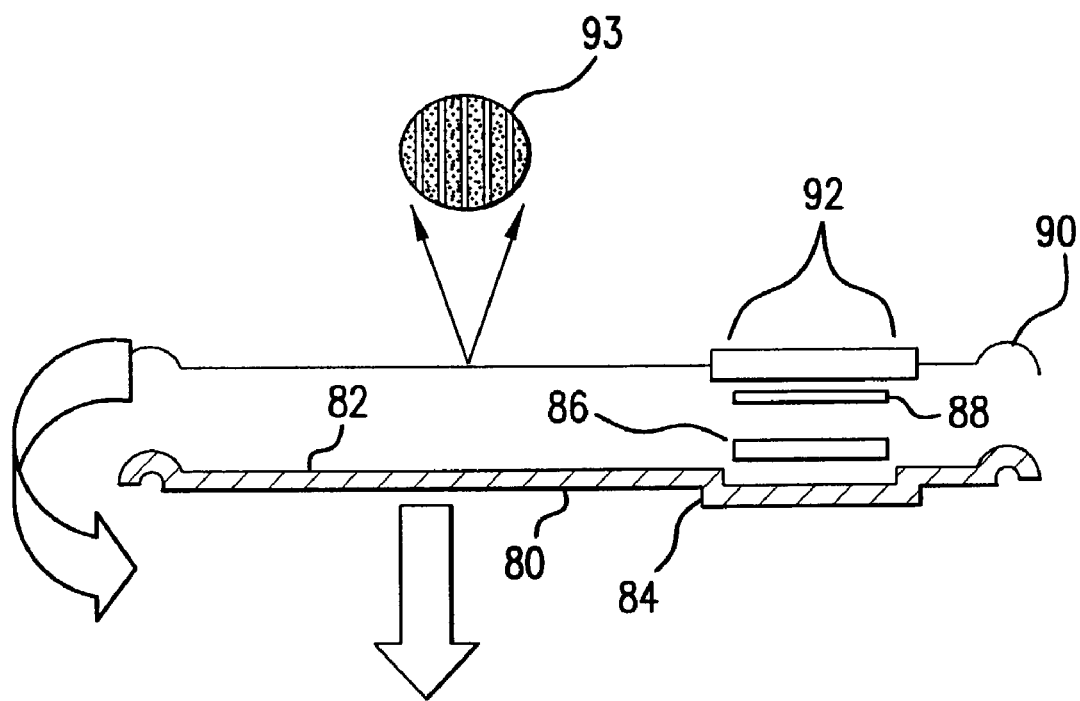
FIG. 10 shows a method of making a license plate having a retroreflective layer and an RF transponder according to the invention.

Car license plates are typically made from metal, acrylic or polycarbonate. Regardless of the material, the process of applying an RF device will usually be similar. This process is described below with reference to FIG. 10 for a metal license plate. First, an upper surface 82 of a metal plate 80 is embossed to form a depressed region 84. An isolation layer 86 (e.g., a ferrite composite layer) is then deposited in depressed region 84. A radio frequency device 88 is then mounted on the isolation layer. In this manner, RF device 88 is able to transmit and receive information without interference from the metal plate 80. Afterward, the license plate can be laminated with, for example, a selectively demetallized retro-reflective material 90. According to a preferred embodiment of the invention, the region of the retro-reflective material 90 above the area 92 where the radio frequency device 88 is mounted will be free of metallized material. Further, the rest of the retro-reflective material 90 is preferably selectively demetallized with a fine line demetallizing pattern 94 using a demetallizing process as described above to reduce interference.

Figure 11:
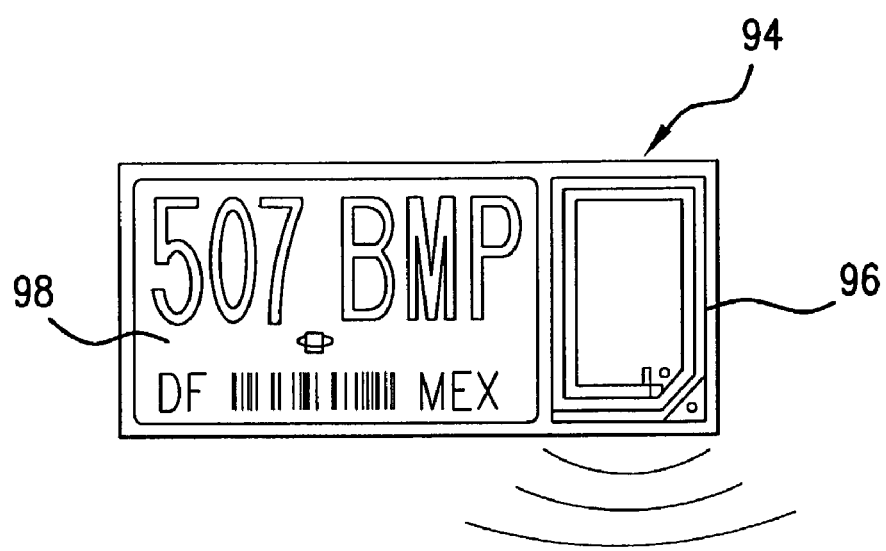
FIG. 11 shows a license plate according to the invention, comprising a retro-reflective layer and an RF transponder made by the method illustrated in FIG. 10.

The resulting license plate is shown in FIG. 11. As can be seen from FIG. 11, the license plate 94 comprises an antenna region 96 and a retro-reflective region 98. The retro-reflective region is shown over-printed with a license plate number. As can be seen from FIG. 11, the retro-reflective material has been removed from the antenna region 96. The antenna can be formed by selectively demetallizing a continuous metal layer using a printing procedure as described above.

Figure 12:
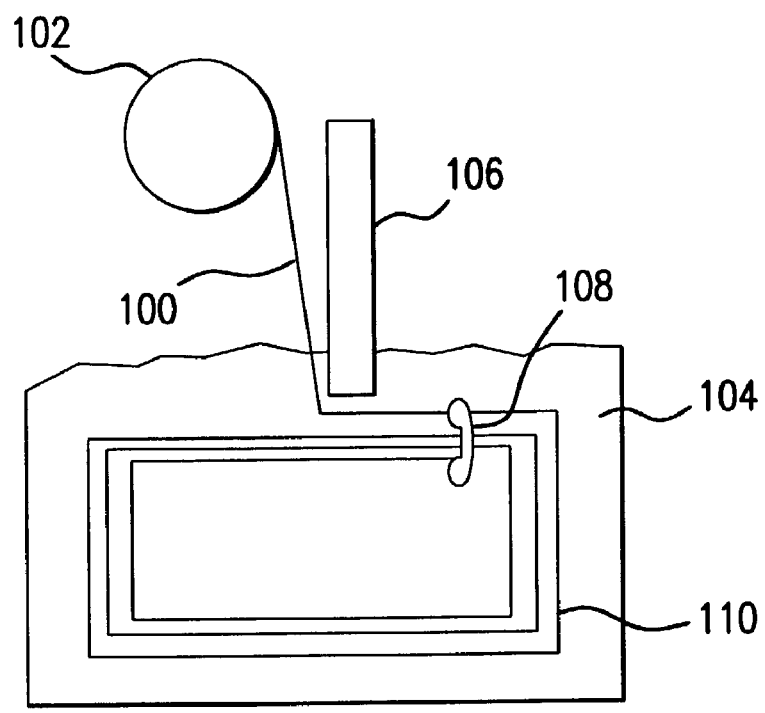
FIG. 12 shows a method of forming an inlaid antenna according to the invention.

An alternative process of forming the antenna comprises producing a thin polymer layer (e.g., polyvinyl chloride (PVC) or polyethylene terephthalate) having an antenna (preferably a copper antenna) embedded therein. Structures of this type are commonly referred to as inlays. A method of manufacturing an inlaid antenna according to the invention is shown in FIG. 12. As shown in FIG. 12, a conductive wire 100 (preferably a copper wire) is unrolled from a spool 102 and embedded in the surface of a polymer sheet 104. As shown in FIG. 12, the conductive wire 100 passes over a thermal ultrasound head 106 and under a bridge 108 before being embedded in the polymer sheet 104 to form the antenna 110. The inlaid antenna can be applied with an auto-adhesive or pressure sensitive adhesive to the base layer or substrate of the identification device. The antenna should be applied in an area of the device that has been demetallized to avoid contact with any metal in the identification device.

Figure 13:
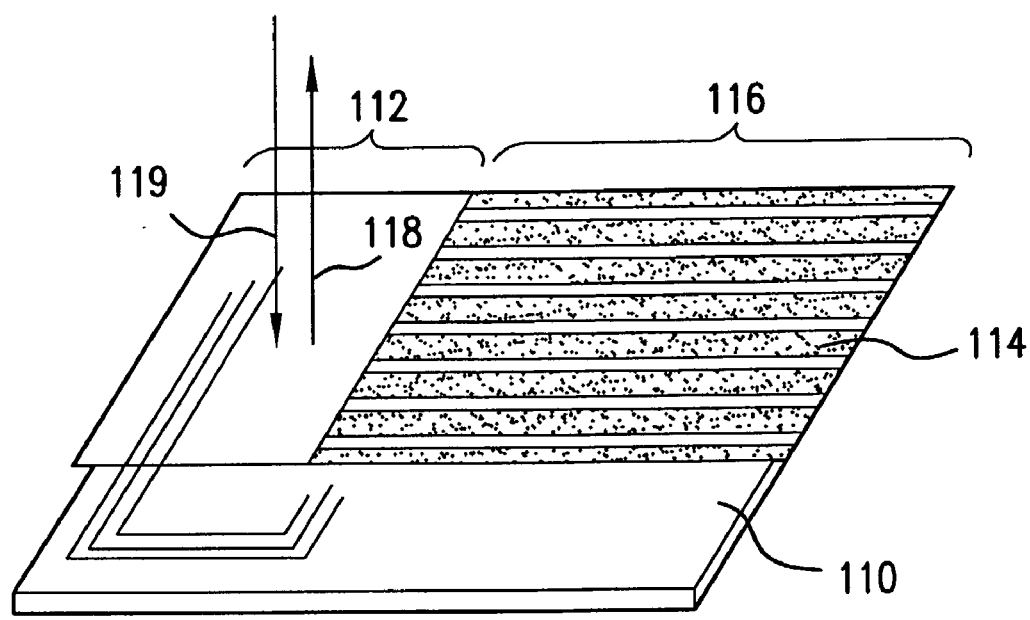
FIG. 13 shows a method of forming an identification device according to the invention comprising inlaying an antenna in the base layer and overlying a selectively demetallized retro-reflective layer.

An alternative way of obtaining a retro-reflective or other metallized material on a metal plate or sticker can be employed wherein the carrier or base layer is a polymer such as PVC or PET. In this embodiment, the antenna can be embedded directly in the carrier using ultrasonic energy as set forth above. The retro-reflective or other metallized layer can then be applied onto the carrier. Portions of the retro-reflective or other metallized layer overlying the antenna should be demetallized to avoid any contact of the antenna with the metal content of the retro-reflective or other metallized material. A fine line demetallization process can be used as describe above over the remainder of the retro-reflective or other metallized material to minimize RF distortion or absorption that can interfere with the radio frequency device. Afterward, an acrylic or epoxy resin can be applied to transform the identification device into a label FIG. 13 shows an identification device according to this embodiment of the invention wherein an inlaid antenna 110 is positioned on a carrier layer (not shown) beneath a demetallized portion 112 of a retro-reflective or other metallized layer 114. Also as shown in FIG. 13, a fine line demetallizing process has been used on the continuous metal portion 116 of the retro-reflective layer 114 to reduce interference and thereby ensure adequate performance of the radio frequency transmitting 118 and receiving 119 functions. In this manner, the retro-reflective or other metallized material properties can be retained while allowing for the adequate transmission and reception of RF energy.

These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention.

What is claimed is:

1. An identification device, comprising:
   a base layer;
   a radio-frequency (RF) transponder comprising an RF chip and an antenna disposed on the base layer, wherein the antenna is in electrical communication with the chip; and
   a metallized region;
   wherein the metalized region includes a holographic image;
      wherein the holographic image and the antenna form a single layer;
   wherein the metallized region has been selectively demetallized, such that the RF transponder is able to transmit and receive information.

2. The device of claim 1, wherein the metallized region includes a retro-reflective layer.

3. The device of claim 1, wherein the base layer has at least one side, and wherein the antenna and the metallized region are located on the same side of the base layer.

4. The device of claim 1, wherein the base layer has at least a first side and a second side, the first side being opposite the second side, and wherein the antenna and the metallized region are located on opposite sides of the base layer.

5. The device of claim 1, wherein the base layer has at least a first side and a second side, the first side being opposite the second side, and wherein a first part of the antenna and the metallized region are located on the first side, and a second part of the antenna is located on the second side of the base layer, and wherein the first part of the antenna is electrically connected to the second part of the antenna.

6. The device of claim 1, wherein the device comprises an upper metal layer positioned above the base layer and a lower metal layer positioned below the base layer, wherein a first part of the antenna is formed on the upper metal layer and a second part of the antenna is formed on the lower metal layer, the device further comprising a through contact connecting the first part of the antenna to the second part of the antenna.

7. The device of claim 1, wherein the metallized region comprises a plurality of electrically isolated holographic regions.

8. The device of claim 1, wherein the base layer is an electrically conductive layer.

9. The device of claim 8, wherein an isolation layer is formed on the base layer.

10. The device of claim 9, wherein the radio frequency (RF) chip is mounted on the isolation layer.

11. The device of claim 9, wherein the base layer includes a depressed region, and wherein the isolation layer is formed in the depressed region.

12. The device of claim 1, wherein the base layer has at least one side, and wherein the antenna and the metallized region are formed on the same side of the base layer in discrete, non-overlapping areas.

13. The device of claim 1, wherein the antenna comprises a conductive wire inlaid in a polymer layer.

14. The device of claim 1, wherein the device is selected from the group consisting of a decal, a license plate, and an identification card.

15. The device of claim 1, wherein the metallized region has been selectively demetallized in a square grid pattern.

16. The device of claim 15, wherein the squares in the square grid pattern have a length of about 5 mm or less.

17. The device of claim 15, wherein the squares in the square grid pattern have a length of about 3 mm or less.

18. An identification device, comprising:
    a base layer;
    a radio-frequency (RF) transponder comprising an RF chip and an antenna disposed on the base layer, wherein the antenna is in electrical communication with the chip; and
    a metallized region;
    wherein the metalized region includes a holographic image;
    wherein the metallized region has been selectively demetallized, such that the RF transponder is able to transmit and receive information and
    wherein the metallized region is in electrical communication with the antenna.

19. The device of claim 18, wherein the metallized region comprises an electronic commutation element.

20. The device of claim 18, wherein the metallized region comprises a capacitor.

21. A method of making an identification device comprising a base layer and a plurality of metallized regions disposed thereon, the method comprising:
    forming an antenna in a first metallized region; and
    forming a holographic image in a second metallized region;
    wherein the antenna is formed by a method comprising:
        transferring a metal etching solution to portions of an exposed surface of the metallized layer using a printing process;
        allowing the etching solution to react with the metal to selectively demetallize the surface; and
        washing the selectively demetallized surface and
        wherein the first and second metallized regions form a single metal layer.

* * * * *

UNITED STATES PATENT AND TRADEMARK OFFICE
CERTIFICATE OF CORRECTION

PATENT NO.         : 7,034,688 B2                              Page 1 of 1
APPLICATION NO.  : 10/118,092
DATED                  : April 25, 2006
INVENTOR(S)         : Reitzler, et al It is certified that error appears in the above-identified patent and that said Letters Patent is hereby corrected as shown below:

Title page, col. 1 section (65) Prior Publication Data– include the folowing:

FOREIGN PATENT DOCUMENTS

| | | |
|---|---|---|
| 10121126.0 | 04/30/01 | Germany |
| 010967 | 10/26/01 | Mexico |
| 010968 | 10/26/01 | Mexico |
| 010969 | 10/26/01 | Mexico |
| 010671 | 10/26/01 | Mexico |
| 003141 | 03/25/02 | Mexico |
| 003202 | 03/26/02 | Mexico |

Signed and Sealed this

Fifteenth Day of August, 2006

JON W. DUDAS
*Director of the United States Patent and Trademark Office*